United States Patent
Hoshino

(10) Patent No.: US 10,241,405 B2
(45) Date of Patent: Mar. 26, 2019

(54) POLYMER AND POSITIVE RESIST COMPOSITION

(71) Applicant: ZEON CORPORATION, Chiyoda-ku, Tokyo (JP)

(72) Inventor: Manabu Hoshino, Tokyo (JP)

(73) Assignee: ZEON CORPORATION, Chiyoda-ku, Tokyo (JP)

( * ) Notice: Subject to any disclaimer, the term of this patent is extended or adjusted under 35 U.S.C. 154(b) by 0 days.

(21) Appl. No.: 15/549,764

(22) PCT Filed: Feb. 15, 2016

(86) PCT No.: PCT/JP2016/000770
§ 371 (c)(1),
(2) Date: Aug. 9, 2017

(87) PCT Pub. No.: WO2016/132725
PCT Pub. Date: Aug. 25, 2016

(65) Prior Publication Data
US 2018/0024432 A1    Jan. 25, 2018

(30) Foreign Application Priority Data

Feb. 20, 2015 (JP) ................................. 2015-031730

(51) Int. Cl.
| | | |
|---|---|---|
| *G03F 7/039* | (2006.01) | |
| *C08F 212/08* | (2006.01) | |
| *C08F 212/12* | (2006.01) | |
| *C08F 220/22* | (2006.01) | |
| *C09D 125/14* | (2006.01) | |

(52) U.S. Cl.
CPC .......... *G03F 7/039* (2013.01); *C08F 212/08* (2013.01); *C08F 212/12* (2013.01); *C08F 220/22* (2013.01); *C09D 125/14* (2013.01); *C08F 2500/01* (2013.01); *C08F 2500/03* (2013.01)

(58) Field of Classification Search
None
See application file for complete search history.

(56) References Cited

U.S. PATENT DOCUMENTS

| | | | | |
|---|---|---|---|---|
| 2018/0011403 A1* | 1/2018 | Hoshino | ................. | G03F 7/039 |
| 2018/0024430 A1* | 1/2018 | Hoshino | ............... | C08F 220/22 |
| | | | | 430/270.1 |
| 2018/0024431 A1* | 1/2018 | Hoshino | ............... | C08F 220/22 |
| | | | | 430/270.1 |

FOREIGN PATENT DOCUMENTS

| | | | | |
|---|---|---|---|---|
| JP | 63137227 A * | 6/1988 | ............. | G03F 7/039 |
| JP | H083636 B2 | 1/1996 | | |
| JP | 2016012104 | 1/2016 | | |
| WO | WO-2016132726 A1 * | 8/2016 | ............ | C08F 212/06 |
| WO | WO-2016132727 A1 * | 8/2016 | ............ | C08F 212/06 |
| WO | WO-2016132728 A1 * | 8/2016 | ............ | C08F 212/06 |

OTHER PUBLICATIONS

Yamaguchi et al, "Linewidth Fluctuations caused by polymer aggregates in resist films", Journal of Phtopolymer Science and Technology, vol. 10, No. 4, pp. 635-640 (Year: 1997).*
Aug. 22, 2017, International Preliminary Report on Patentability issued in the International Patent Application No. PCT/JP2016/000770.
Apr. 26, 2016, International Search Report issued in the International Patent Application No. PCT/JP2016/000770.
Katsuya Okubo et al., "Cho Bisai Kako-yo Denshisen Polymer Resist no Kaihatsu to Hyoka", Polymer Material Forum Koen Yokoshu, 2012, 21, p. 38.
M. Otani et al., "Improvement of polymer type EB resist sensitivity and line edge roughness", Proceedings of SPIE, 2011, 8081, pp. 808107/1-808107/8.
T. Yamaguchi et al., "Influence of molecular weight of resist polymers on surface roughness and line-edge roughness", J. Vac. Sci. Technol. B, 2004, 22 (6), pp. 2604-2610.
T. Yamaguchi et al., "Molecular weight effect on line-edge roughness", Proceedings of SPIE, 2003, 5039, pp. 1212-1219.

* cited by examiner

*Primary Examiner* — Cynthia Hamilton
(74) *Attorney, Agent, or Firm* — Kenja IP Law PC

(57) ABSTRACT

Provided are a polymer that can be favorably used as a positive resist having a low film reduction rate under low irradiation, a high γ value, and high sensitivity, and a positive resist composition that can efficiently form a high-resolution pattern. The polymer includes an α-methylstyrene unit and a methyl α-chloroacrylate unit, and has a molecular weight distribution (Mw/Mn) of less than 1.48. In the polymer, the proportion of components having a molecular weight of less than 6,000 is no greater than 0.5% and the proportion of components having a molecular weight of greater than 80,000 is no greater than 6.0%. The positive resist composition contains the aforementioned polymer and a solvent.

4 Claims, No Drawings

POLYMER AND POSITIVE RESIST COMPOSITION

TECHNICAL FIELD

The present disclosure relates to a polymer and a positive resist composition, and in particular relates to a polymer that is suitable for use as a positive resist and a positive resist composition that contains this polymer.

BACKGROUND

Polymers that display increased solubility in a developer after undergoing main chain scission through irradiation with ionizing radiation, such as an electron beam, or short-wavelength light, such as ultraviolet light, are conventionally used as main chain scission-type positive resists in fields such as semiconductor production. (Hereinafter, the term "ionizing radiation or the like" is used to refer collectively to ionizing radiation and short-wavelength light.)

PTL 1 discloses one example of a main chain scission-type positive resist having high sensitivity. The disclosed positive resist is formed from an α-methylstyrene-methyl α-chloroacrylate copolymer including an α-methylstyrene unit and a methyl α-chloroacrylate unit.

CITATION LIST

Patent Literature

PTL 1: JP H8-3636 B

SUMMARY

Technical Problem

In order to refine and increase the resolution of a pattern obtained using a main chain scission-type positive resist, there is demand for a resist that enables clear division, to as great an extent as possible, between regions that undergo main chain scission through irradiation with ionizing radiation or the like and then dissolve in a developer, and remaining regions that do not dissolve in the developer. There also demand to improve the efficiency of pattern formation using a resist and to refine the obtained pattern in order to improve resolution. Specifically, from a viewpoint of raising the efficiency of pattern formation through irradiation of a resist with ionizing radiation or the like, a resist is required to undergo main chain scission to display increased solubility in a developer through a lower irradiation dose (i.e., have higher sensitivity). On the other hand, from a viewpoint of enabling formation of a finer pattern having higher resolution, a resist is required to have a low film reduction rate in a state of low irradiation with ionizing radiation or the like (film reduction rate under low irradiation) such that top-collapse is suppressed in resist regions that are to be left without being dissolved, and is also required to have a high γ value such as to display a characteristic of not dissolving in a developer before the irradiation dose of ionizing radiation or the like reaches a specific amount, and then rapidly undergoing main chain scission and dissolving in the developer once the irradiation dose reaches the specific amount. Note that the γ value expresses the magnitude of the gradient of a sensitivity curve indicating a relationship between the common logarithm of the irradiation dose of ionizing radiation or the like and the remaining film thickness of the resist after development.

However, the positive resist formed from the α-methylstyrene-methyl α-chloroacrylate copolymer described in PTL 1 suffers from a problem of not having an adequately high γ value and sensitivity, and also suffers from a problem of excessive film reduction in a state of low irradiation with ionizing radiation or the like. Accordingly, there is room for improvement over the positive resist formed from the α-methylstyrene-methyl α-chloroacrylate copolymer described in PTL 1 in terms of achieving a favorable balance of increasing the γ value, improving sensitivity, and reducing the film reduction rate under low irradiation.

One objective of the present disclosure is to provide a polymer that can be favorably used as a positive resist having a low film reduction rate under low irradiation, a high γ value, and high sensitivity.

Another objective of this disclosure is to provide a positive resist composition that can efficiently form a high-resolution pattern.

Solution to Problem

The inventor conducted diligent investigation to achieve the objectives set forth above. Through this investigation, the inventor discovered that an α-methylstyrene-methyl α-chloroacrylate copolymer having a specific molecular weight distribution, and in which the proportion of components having a molecular weight of less than 6,000 and the proportion of components having a molecular weight of greater than 80,000 are each no greater than a specific value, can be favorably used as a positive resist having a high γ value, high sensitivity, and a low film reduction rate under low irradiation. This discovery led to the present disclosure.

Specifically, the present disclosure aims to advantageously solve the problems set forth above by disclosing a polymer including an α-methyl styrene unit and a methyl α-chloroacrylate unit, wherein the polymer has a molecular weight distribution (Mw/Mn) of less than 1.48, a proportion of components having a molecular weight of less than 6,000 is no greater than 0.5%, and a proportion of components having a molecular weight of greater than 80,000 is no greater than 6.0%. An α-methylstyrene-methyl α-chloroacrylate copolymer having a molecular weight distribution (Mw/Mn) of less than 1.48, and in which the proportion of components having a molecular weight of less than 6,000 is no greater than 0.5% and the proportion of components having a molecular weight of greater than 80,000 is no greater than 6.0%, can be favorably used as a positive resist since the copolymer has a high γ value, high sensitivity, and a low film reduction rate under low irradiation during use as a positive resist.

The "molecular weight distribution (Mw/Mn)" referred to herein is the ratio of the weight average molecular weight (Mw) relative to the number average molecular weight (Mn). The "number average molecular weight (Mn)" and "weight average molecular weight (Mw)" referred to herein can be measured by gel permeation chromatography.

The "proportion of components having a molecular weight of less than 6,000" referred to herein can be determined using a chromatogram obtained through gel permeation chromatography by calculating the total area (C) of peaks in the chromatogram for components having a molecular weight of less than 6,000 as a proportion (=(C/A)×100%) relative to the total area (A) of all peaks in the chromatogram.

The "proportion of components having a molecular weight of greater than 80,000" referred to herein can be determined using a chromatogram obtained through gel permeation chromatography by calculating the total area (D) of peaks in the chromatogram for components having a molecular weight of greater than 80,000 as a proportion (=(D/A)×100%) relative to the total area (A) of all peaks in the chromatogram.

In the presently disclosed polymer, a proportion of components having a molecular weight of less than 10,000 is preferably no greater than 0.8%. As a result of the proportion of components having a molecular weight of less than 10,000 being no greater than 0.8%, they value can be further increased while also ensuring an adequately low film reduction rate under low irradiation during use as a positive resist.

The "proportion of components having a molecular weight of less than 10,000" referred to herein can be determined using a chromatogram obtained through gel permeation chromatography by calculating the total area (B) of peaks in the chromatogram for components having a molecular weight of less than 10,000 as a proportion (=(B/A)×100%) relative to the total area (A) of all peaks in the chromatogram.

The presently disclosed polymer preferably has a weight average molecular weight (Mw) of at least 30,000. As a result of the weight average molecular weight (Mw) being at least 30,000, the γ value can be further increased while also ensuring an adequately low film reduction rate under low irradiation during use as a positive resist.

In the presently disclosed polymer, a proportion of components having a molecular weight of greater than 100,000 is preferably at least 0.5%. As a result of the proportion of components having a molecular weight of greater than 100,000 being at least 0.5%, the γ value can be further increased while also ensuring an adequately low film reduction rate under low irradiation during use as a positive resist.

The "proportion of components having a molecular weight of greater than 100,000" referred to herein can be determined using a chromatogram obtained through gel permeation chromatography by calculating the total area (E) of peaks in the chromatogram for components having a molecular weight of greater than 100,000 as a proportion (=(E/A)×100%) relative to the total area (A) of all peaks in the chromatogram.

Moreover, the present disclosure aims to advantageously solve the problems set forth above by disclosing a positive resist composition containing any one of the polymers described above and a solvent. As a result of the above-described polymer being contained as a positive resist, a high-resolution pattern can be efficiently formed.

Advantageous Effect

Through the presently disclosed polymer, it is possible to provide a positive resist having a low film reduction rate under low irradiation, a high γ value, and high sensitivity.

Moreover, through the presently disclosed positive resist composition, it is possible to efficiently form a high-resolution pattern.

DETAILED DESCRIPTION

The following provides a detailed description of embodiments of the present disclosure.

The presently disclosed polymer can be favorably used as a main chain scission-type positive resist that undergoes main chain scission to lower molecular weight upon irradiation with ionizing radiation, such as an electron beam, or short-wavelength light, such as ultraviolet light. The presently disclosed positive resist composition contains the presently disclosed polymer as a positive resist.

(Polymer)

The presently disclosed polymer is an α-methylstyrene-methyl α-chloroacrylate copolymer that includes an α-methylstyrene unit and a methyl α-chloroacrylate unit, that has a molecular weight distribution (Mw/Mn) of less than 1.48, and in which the proportion of components having a molecular weight of less than 6,000 is no greater than 0.5% and the proportion of components having a molecular weight of greater than 80,000 is no greater than 6.0%. As a result of the presently disclosed polymer including a structural unit derived from methyl α-chloroacrylate having a chloro group (—Cl) at the α-position (i.e., a methyl α-chloroacrylate unit), the presently disclosed polymer readily undergoes main chain scission to lower molecular weight upon irradiation with ionizing radiation or the like (for example, an electron beam, a KrF laser, an ArF laser, or an EUV laser). Moreover, as a result of the presently disclosed polymer having a molecular weight distribution (Mw/Mn) of less than 1.48, the proportion of components having a molecular weight of less than 6,000 being no greater than 0.5%, and the proportion of components having a molecular weight of greater than 80,000 being no greater than 6.0%, the presently disclosed polymer can be favorably used as a main chain scission-type positive resist since the presently disclosed polymer has a high γ value, high sensitivity, and a low film reduction rate under low irradiation during use as a positive resist.

<α-Methylstyrene Unit>

The α-methylstyrene unit is a structural unit derived from α-methyl styrene. As a result of the presently disclosed polymer including the α-methylstyrene unit, the presently disclosed polymer displays excellent dry etching resistance during use as a positive resist due to the protective stability of the benzene ring in the α-methyl styrene unit.

The presently disclosed polymer preferably comprises at least 30 mol % and no greater than 70 mol % of α-methyl styrene units.

<Methyl α-Chloroacrylate Unit>

The methyl α-chloroacrylate unit is a structural unit derived from methyl α-chloroacrylate. As a result of the presently disclosed polymer including the methyl α-chloroacrylate unit, the presently disclosed polymer readily undergoes main chain scission through chlorine atom dissociation and β-cleavage reaction upon irradiation with ionizing radiation or the like. Accordingly, a positive resist formed from the presently disclosed polymer displays high sensitivity.

The presently disclosed polymer preferably comprises at least 30 mol % and no greater than 70 mol % of methyl α-chloroacrylate units.

<Molecular Weight Distribution>

The molecular weight distribution (Mw/Mn) of the presently disclosed polymer is required to be less than 1.48, is preferably no greater than 1.47, more preferably no greater than 1.40, even more preferably no greater than 1.35, and particularly preferably no greater than 1.30, and is preferably at least 1.20, and more preferably at least 1.27. If the molecular weight distribution (Mw/Mn) of the polymer is 1.48 or more, the γ value during use as a positive resist cannot be adequately increased. Moreover, when the molecular weight distribution (Mw/Mn) of the polymer is at least 1.20, sensitivity during use as a positive resist can be further increased, and the polymer can be easily produced.

[Weight Average Molecular Weight]

The weight average molecular weight (Mw) of the presently disclosed polymer is preferably at least 30,000, more preferably at least 35,000, and even more preferably at least 36,000, and is preferably no greater than 100,000, more preferably no greater than 70,000, even more preferably no greater than 60,000, and particularly preferably no greater than 40,000. When the weight average molecular weight (Mw) of the polymer is at least 30,000, an adequately low film reduction rate under low irradiation during use as a positive resist can be ensured, and when the weight average molecular weight (Mw) of the polymer is no greater than 100,000, sensitivity can be further increased. Moreover, when the weight average molecular weight (Mw) of the polymer is within any of the ranges set forth above, the γ value during use as a positive resist can be further increased.

[Number Average Molecular Weight]

The number average molecular weight (Mn) of the presently disclosed polymer is preferably at least 25,000, more preferably at least 27,000, and even more preferably at least 28,000, and is preferably no greater than 100,000, more preferably no greater than 60,000, even more preferably no greater than 50,000, and particularly preferably no greater than 40,000. When the number average molecular weight (Mn) of the polymer is at least 25,000, an adequately low film reduction rate under low irradiation during use as a positive resist can be ensured, and when the number average molecular weight (Mn) of the polymer is no greater than 100,000, sensitivity can be further increased. Moreover, when the number average molecular weight (Mn) of the polymer is within any of the ranges set forth above, the γ value during use as a positive resist can be further increased.

<Proportion of Components Having Molecular Weight of Less than 6,000> in the presently disclosed polymer, the proportion of components having a molecular weight of less than 6,000 is required to be no greater than 0.5%, is preferably no greater than 0.2%, and more preferably no greater than 0.15%, and is preferably at least 0.03%, and more preferably at least 0.05%. If the proportion of components having a molecular weight of less than 6,000 is greater than 0.5%, the film reduction rate under low irradiation during use as a positive resist cannot be adequately reduced. On the other hand, when the proportion of components having a molecular weight of less than 6,000 is no greater than 0.2%, in addition to adequately lowering the film reduction rate under low irradiation, the γ value during use as a positive resist can also be increased. On the other hand, when the proportion of components having a molecular weight of less than 6,000 is at least 0.03%, sensitivity during use as a positive resist can be further increased.

<Proportion of Components Having Molecular Weight of Less than 10,000>

In the presently disclosed polymer, the proportion of components having a molecular weight of less than 10,000 is preferably no greater than 0.8%, and is preferably at least 0.4%, and more preferably at least 0.5%. When the proportion of components having a molecular weight of less than 10,000 is no greater than 0.8%, an adequately low film reduction rate under low irradiation during use as a positive resist can be ensured and the γ value can be further increased. On the other hand, when the proportion of components having a molecular weight of less than 10,000 is at least 0.4%, sensitivity during use as a positive resist can be further increased.

<Proportion of Components Having Molecular Weight of Greater than 80,000>

In the presently disclosed polymer, the proportion of components having a molecular weight of greater than 80,000 is required to be no greater than 6.0%, is preferably no greater than 3.5%, and is preferably at least 0.5%, and more preferably at least 1.0%. If the proportion of components having a molecular weight of greater than 80,000 is greater than 6.0%, sensitivity during use as a positive resist cannot be adequately increased. On the other hand, when the proportion of components having a molecular weight of greater than 80,000 is at least 0.5%, the film reduction rate under low irradiation during use as a positive resist can be further reduced. Moreover, when the proportion of components having a molecular weight of greater than 80,000 is within any of the ranges set forth above, they value during use as a positive resist can be further increased.

<Proportion of Components Having Molecular Weight of Greater than 100,000>

In the presently disclosed polymer, the proportion of components having a molecular weight of greater than 100,000 is preferably at least 0.5%, and more preferably at least 1.0%, and is preferably no greater than 2.0%, and more preferably no greater than 1.5%. When the proportion of components having a molecular weight of greater than 100,000 is at least 0.5%, the film reduction rate under low irradiation during use as a positive resist can be further reduced. On the other hand, when the proportion of components having a molecular weight of greater than 100,000 is no greater than 2.0%, sensitivity during use as a positive resist can be further increased. Moreover, when the proportion of components having a molecular weight of greater than 100,000 is within any of the ranges set forth above, they value during use as a positive resist can be further increased.

(Production Method Polymer)

The polymer having the properties set forth above can be produced by, for example, polymerizing a monomer composition containing α-methyl styrene and methyl α-chloroacrylate, and then purifying the resultant polymerized product.

The composition, molecular weight distribution, weight average molecular weight, and number average molecular weight of the polymer, and the proportions of components having various molecular weights in the polymer can be adjusted by altering the polymerization conditions and the purification conditions. In one specific example, the weight average molecular weight and the number average molecular weight can be reduced by raising the polymerization temperature. In another specific example, the weight average molecular weight and the number average molecular weight can be reduced by shortening the polymerization time.

<Polymerization of Monomer Composition>

The monomer composition used in production of the presently disclosed polymer may be a mixture containing monomers (inclusive of α-methylstyrene and methyl α-chloroacrylate), a solvent, a polymerization initiator, and optionally added additives. Polymerization of the monomer composition may be carried out by a known method. Cyclopentanone or the like is preferably used as the solvent and a radical polymerization initiator such as azobisisobutyronitrile is preferably used as the polymerization initiator.

The composition of the polymer can be adjusted by altering the percentage content of each monomer in the monomer composition used in polymerization. The proportion of high-molecular weight components contained in the polymer can be adjusted by altering the amount of the polymerization initiator. For example, the proportion of high-molecular weight components can be increased by reducing the amount of the polymerization initiator.

A polymerized product obtained through polymerization of the monomer composition may be collected by adding a good solvent such as tetrahydrofuran to a solution containing the polymerized product and subsequently dripping the solution to which the good solvent has been added into a poor solvent such as methanol to coagulate the polymerized product, and the polymerized product may then be purified as described below. However, the polymerized product is not specifically limited to being collected and purified in this manner.

<Purification of Polymerized Product>

The purification method used to purify the resultant polymerized product to obtain the polymer having the properties set forth above may be, but is not specifically limited to, a known purification method such as re-precipitation or column chromatography. Of these purification methods, purification by re-precipitation is preferable.

Also note that purification of the polymerized product may be repeated multiple times.

Purification of the polymerized product by re-precipitation is, for example, preferably carried out by dissolving the resultant polymerized product in a good solvent such as tetrahydrofuran, and subsequently dripping the resultant solution into a mixed solvent of a good solvent, such as tetrahydrofuran, and a poor solvent, such as methanol, to precipitate a portion of the polymerized product. When purification of the polymerized product is carried out by dripping a solution of the polymerized product into a mixed solvent of a good solvent and a poor solvent as described above, the molecular weight distribution, weight average molecular weight, and number average molecular weight of the resultant polymer and the proportion of low-molecular weight components in the resultant polymer can be easily adjusted by altering the types and/or mixing ratio of the good solvent and the poor solvent. In one specific example, the molecular weight of polymer that precipitates in the mixed solvent can be increased by increasing the proportion of the good solvent in the mixed solvent.

Also note that in a situation in which the polymerized product is purified by re-precipitation, polymer that precipitates in the mixed solvent of the good solvent and the poor solvent may be used as the presently disclosed polymer, or polymer that does not precipitate in the mixed solvent (i.e., polymer dissolved in the mixed solvent) may be used as the presently disclosed polymer, so long as the polymer that is used has the desired properties. Polymer that does not precipitate in the mixed solvent can be collected from the mixed solvent by a known technique such as concentration to dryness.

(Positive Resist Composition)

The presently disclosed positive resist composition contains the polymer described above and a solvent, and optionally further contains known additives that can be compounded in a resist composition. As a result of the presently disclosed positive resist composition containing the above-described polymer as a positive resist, a high-resolution pattern can be efficiently formed using a resist film obtained through application and drying of the presently disclosed positive resist composition.

<Solvent>

The solvent may be any known solvent in which the above-described polymer is soluble. Of such solvents, anisole is preferable from a viewpoint of obtaining a positive resist composition of appropriate viscosity and improving application properties of the positive resist composition.

EXAMPLES

The following provides a more specific description of the present disclosure based on examples. However, the present disclosure is not limited to the following examples. In the following description, "%" and "parts" used in expressing quantities are by mass, unless otherwise specified.

In the examples and comparative examples, the following methods were used to measure and evaluate the weight average molecular weight, number average molecular weight, and molecular weight distribution of a polymer, the proportions of components having various molecular weights in the polymer, and the film reduction rate under low irradiation, γ value, and sensitivity of a positive resist formed from the polymer.

<Weight Average Molecular Weight, Number Average Molecular Weight, and Molecular Weight Distribution>

The weight average molecular weight (Mw) and number average molecular weight (Mn) of an obtained polymer were measured by gel permeation chromatography, and then the molecular weight distribution (Mw/Mn) of the polymer was calculated.

Specifically, the weight average molecular weight (Mw) and number average molecular weight (Mn) of the polymer were determined as values in terms of standard polystyrene using a gel permeation chromatograph (HLC-8220 produced by Tosoh Corporation) with tetrahydrofuran as a developing solvent. The molecular weight distribution (Mw/Mn) was then calculated.

<Proportions of Components Having Various Molecular Weights in Polymer>

A chromatogram of the polymer was obtained using a gel permeation chromatograph (HLC-8220 produced by Tosoh Corporation) with tetrahydrofuran as a developing solvent. The total area (A) of all peaks, the total area (B) of peaks for components having a molecular weight of less than 10,000, the total area (C) of peaks for components having a molecular weight of less than 6,000, the total area (D) of peaks for components having a molecular weight of greater than 80,000, and the total area (E) of peaks for components having a molecular weight of greater than 100,000 were determined from the obtained chromatogram. The proportions of components having various molecular weights were calculated using the following formulae.

Proportion of components having molecular weight of less than $10,000(\%) = (B/A) \times 100$ Proportion of components having molecular weight of less than $6,000(\%) = (C/A) \times 100$ Proportion of components having molecular weight of greater than $80,000(\%) = (D/A) \times 100$ Proportion of components having molecular weight of greater than $100,000(\%) = (E/A) \times 100$ <Film Reduction Rate Under Low Irradiation>

A spin coater (MS-A150 produced by Mikasa Co., Ltd.) was used to apply a positive resist composition onto a silicon wafer of 4 inches in diameter such as to have a thickness of 500 nm. The applied positive resist composition was heated for 3 minutes by a hot-plate at a temperature of 180° C. to form a resist film on the silicon wafer. The initial thickness $T_0$ of the resultant resist film was measured using an optical film thickness meter (Lambda Ace produced by Dainippon Screen Mfg. Co., Ltd.). Next, an electron beam lithography device (ELS-5700 produced by Elionix Inc.) was used to draw a pattern over the resist film with an irradiation dose of 16 µC/cm². Development treatment was carried out for 1 minute at a temperature of 23° C. using amyl acetate (ZED-N50 produced by Leon Corporation) as a resist developer and then rinsing was carried out for 10 seconds using isopropyl alcohol. Next, the aforementioned optical film thickness meter was used to measure the thickness $T_1$ of the resist film in a region in which the drawing had been performed. The film reduction rate under low irradiation (0≤film reduction rate≤1.00) was calculated by the following formula and was evaluated in accordance with the following standard. A smaller value for the film reduction rate under low irradiation indicates that a high-resolution pattern can be favorably formed with a smaller amount of top-collapse.

Film reduction rate under low irradiation=$\{(T_0-T_1)/T_0\}$

A: Film reduction rate under low irradiation of no greater than 0.011

B: Film reduction rate under low irradiation of greater than 0.011

<γ Value>

A resist film was formed on a silicon wafer in the same way as in evaluation of the "film reduction rate under low irradiation". An electron beam lithography device (ELS-5700 produced by Elionix Inc.) was used to draw a plurality of patterns (dimensions: 500 µm×500 µm) over the resist film with different electron beam irradiation doses. The electron beam irradiation dose was varied in a range of from 4 µC to 152 µC in increments of 4 µC. Development treatment was carried out for 1 minute at a temperature of 23° C. using amyl acetate (ZED-N50 produced by Zeon Corporation) as a resist developer and then rinsing was carried out for 10 seconds using isopropyl alcohol. Next, an optical film thickness meter (Lambda Ace produced by Dainippon Screen Mfg. Co., Ltd.) was used to measure the thickness of the resist film in regions in which drawing had been performed. A sensitivity curve was prepared that indicated a relationship between the common logarithm of the total electron beam irradiation dose and the film retention rate of the resist film after development (=thickness of resist film after development/thickness of resist film formed on silicon wafer). The γ value was determined with respect to the obtained sensitivity curve (horizontal axis: common logarithm of total electron beam irradiation dose, vertical axis: film retention rate of resist film (0≤film retention rate≤1.00)) by the following formula. In the following formula, $E_0$ is the logarithm of the total irradiation dose obtained when the sensitivity curve is fitted to a quadratic function in a range from a film retention rate of 0.20 to a film retention rate of 0.80, and then a film retention rate of 0 is substituted with respect to the obtained quadratic function (function of film retention rate and common logarithm of total irradiation dose). Also, $E_1$ is the logarithm of the total irradiation dose obtained when a straight line is prepared that joins points on the obtained quadratic function corresponding to film retention rates of 0 and 0.50 (linear approximation for gradient of sensitivity curve), and then a film retention rate of 1.00 is substituted with respect to the obtained straight line (function of film retention rate and common logarithm of total irradiation dose). The following formula expresses the gradient of the straight line between a film retention rate of 0 and a film retention rate of 1.00.

$$\gamma = \left|\log_{10}\left(\frac{E_1}{E_0}\right)\right|^{-1}$$

The γ value was evaluated in accordance with the following standard. A larger γ value indicates that the sensitivity curve has a larger gradient and that a high-resolution pattern can be more favorably formed.

A: γ Value of greater than 8.5

B: γ Value of greater than 7.5 and no greater than 8.5

C: γ Value of no greater than 7.5

<Sensitivity>

A resist film was formed on a silicon wafer, and a sensitivity curve and a linear approximation for the gradient of the sensitivity curve were prepared in the same way as in evaluation of the "γ value". Next, the total electron beam irradiation dose Eth (µC/cm²) was determined for a point on the straight line (linear approximation for the gradient of sensitivity curve) at which the film retention rate was 0. Eth was evaluated in accordance with the following standard. A smaller value for Eth indicates higher resist sensitivity.

A: Eth of less than 63.0 µC/cm²

B: Eth of at least 63.0 µC/cm² and no greater than 65.0 µC/cm²

C: Eth of greater than 65.0 µC/cm²

Example 1

<Production of Polymer>

[Polymerization of Monomer Composition]

A monomer composition containing 3.0 g of methyl α-chloroacrylate and 6.88 g of α-methylstyrene as monomers, 2.47 g of cyclopentanone as a solvent, and 0.03273 g of azobisisobutyronitrile as a polymerization initiator was added into a glass container. The glass container was tightly sealed and purged with nitrogen, and was then stirred for 6.5 hours in a 78° C. thermostatic chamber under a nitrogen atmosphere. Thereafter, the glass container was returned to room temperature, the inside of the glass container was exposed to the atmosphere, and then 30 g of tetrahydrofuran (THF) was added to the resultant solution. The solution to which the THF had been added was then dripped into 300 g of methanol to precipitate a polymerized product. Thereafter, the solution containing the polymerized product that had been precipitated was filtered using a Kiriyama funnel to obtain a white coagulated material (polymerized product). The obtained polymerized product had a weight average molecular weight (Mw) of 29,000 and a molecular weight distribution (Mw/Mn) of 1.56. Moreover, the obtained polymerized product comprised 50 mol % of α-methylstyrene units and 50 mol % of methyl α-chloroacrylate units.

[Purification of Polymerized Product]

Next, the obtained polymerized product was dissolved in 100 g of THF and the resultant solution was then dripped into a mixed solvent comprising 550 g of THF and 450 g of methanol (MeOH) to precipitate a white coagulated material (polymer including αmethyl styrene units and methyl α-chloroacrylate units). Thereafter, the solution containing the polymer that had been precipitated was filtered using a Kiriyama funnel to obtain a white polymer. The weight average molecular weight, number average molecular weight, and molecular weight distribution of the obtained polymer, and the proportions of components having various molecular weights in the obtained polymer were measured. The results are shown in Table 1.

<Production of Positive Resist Composition>

The obtained polymer was dissolved in anisole used as a solvent to produce a resist solution (positive resist composition) in which the concentration of the polymer was 11 mass %. The film reduction rate under low irradiation, γ value, and sensitivity of a positive resist formed from the polymer were evaluated. The results are shown in Table 1.

Example 2

A polymerized product, a polymer, and a positive resist composition were produced in the same way as in Example 1 with the exception that the amount of azobisisobutyronitrile used as a polymerization initiator in polymerization of the monomer composition was changed to 0.04364 g. Measurement and evaluation were carried out in the same way as in Example 1. The results are shown in Table 1.

The pre-purification polymerized product had a weight average molecular weight (Mw) of 24,000 and a molecular weight distribution (Mw/Mn) of 1.53.

Comparative Example 1

A polymerized product (polymer including α-methylstyrene units and methyl α-chloroacrylate units) and a positive resist composition were produced in the same way as in Example 1 with the exception that the amount of azobisisobutyronitrile used as a polymerization initiator in polymerization of the monomer composition was changed to 0.01091 g, and the positive resist composition was produced using, as a polymer, a polymerized product collected by filtration after polymerization of the monomer composition, without carrying out purification of the polymerized product. Measurement and evaluation were carried out in the same way as in Example 1. The results are shown in Table 1.

Comparative Example 2

A polymerized product, a polymer, and a positive resist composition were produced in the same way as in Example 1 with the exception that the amount of azobisisobutyronitrile used as a polymerization initiator in polymerization of the monomer composition was changed to 0.01091 g and a mixed solvent comprising 600 g of THF and 400 g of MeOH was used as the mixed solvent in purification of the polymerized product. Measurement and evaluation were carried out in the same way as in Example 1. The results are shown in Table 1.

The pre-purification polymerized product had a weight average molecular weight (Mw) of 55,000 and a molecular weight distribution (Mw/Mn) of 1.85.

Comparative Example 3

<Production of Polymer>
[Polymerization of Monomer Composition]
A monomer composition was polymerized to obtain a polymerized product in the same way as in Example 1 with the exception that the amount of azobisisobutyronitrile used as a polymerization initiator was changed to 0.01091 g. The polymerized product had a weight average molecular weight (Mw) of 55,000 and a molecular weight distribution (Mw/Mn) of 1.85.
[Purification of Polymerized Product]
The obtained polymerized product was dissolved in 100 g of THF and the resultant solution was then dripped into a mixed solvent comprising 600 g of THF and 400 g of MeOH to precipitate a white coagulated material. Thereafter, the solution containing the coagulated material was filtered using a Kiriyama funnel, and the filtrate was collected. The filtrate was concentrated to dryness to obtain a white coagulated material (polymer including α-methylstyrene units and methyl α-chloroacrylate units). The weight average molecular weight, number average molecular weight, and molecular weight distribution of the obtained polymer, and the proportions of components having various molecular weights in the obtained polymer were measured in the same way as in Example 1. The results are shown in Table 1.
<Production of Positive Resist Composition>
A positive resist composition was produced in the same way as in Example 1 with the exception that the polymer produced as set forth above was used. Evaluation was carried out in the same way as in Example 1. The results are shown in Table 1.

Comparative Example 4

<Production of Polymer>
[Polymerization of Monomer Composition]
A monomer composition was polymerized to obtain a polymerized product in the same way as in Example 1 with the exception that the amount of azobisisobutyronitrile used as a polymerization initiator was changed to 0.01091 g. The polymerized product had a weight average molecular weight (Mw) of 55,000 and a molecular weight distribution (Mw/Mn) of 1.85.
[Purification of Polymerized Product]
The obtained polymerized product was dissolved in 100 g of THF and the resultant solution was then dripped into a mixed solvent comprising 600 g of THF and 400 g of MeOH to precipitate a white coagulated material. Thereafter, the solution containing the coagulated material was filtered using a Kiriyama funnel to obtain the white coagulated material that had precipitated. The obtained coagulated material had a weight average molecular weight (Mw) of 65,000 and a molecular weight distribution (Mw/Mn) of 1.47.

Next, the obtained coagulated material was re-dissolved in 100 g of THF and the resultant solution was once again dripped into a mixed solvent comprising 650 g of THF and 350 g of MeOH to re-precipitate a white coagulated material. Thereafter, the solution containing the coagulated material that had been re-precipitated was filtered using a Kiriyama funnel, and the filtrate was collected. The filtrate was concentrated to dryness to obtain a white coagulated material (polymer including α-methylstyrene units and methyl α-chloroacrylate units). The weight average molecular weight, number average molecular weight, and molecular weight distribution of the obtained polymer, and the proportions of components having various molecular weights in the obtained polymer were measured in the same way as in Example 1. The results are shown in Table 1.
<Production of Positive Resist Composition>
A positive resist composition was produced in the same way as in Example 1 with the exception that the polymer produced as set forth above was used. Evaluation was carried out in the same way as in Example 1. The results are shown in Table 1.

Comparative Example 5

A polymerized product, a polymer, and a positive resist composition were produced in the same way as in Example 1 with the exception that the amount of azobisisobutyronitrile used as a polymerization initiator in polymerization of the monomer composition was changed to 0.02182 g and a mixed solvent comprising 600 g of THF and 400 g of MeOH was used as the mixed solvent in purification of the polymerized product. Measurement and evaluation were carried out in the same way as in Example 1. The results are shown in Table 1.

The pre-purification polymerized product had a weight average molecular weight (Mw) of 35,000 and a molecular weight distribution (Mw/Mn) of 1.60.

Comparative Example 6

A polymerized product, a polymer, and a positive resist composition were produced in the same way as in Example 1 with the exception that the amount of azobisisobutyronitrile used as a polymerization initiator in polymerization of the monomer composition was changed to 0.02182 g. Measurement and evaluation were carried out in the same way as in Example 1. The results are shown in Table 1.

The pre-purification polymerized product had a weight average molecular weight (Mw) of 35,000 and a molecular weight distribution (Mw/Mn) of 1.60.

TABLE 1

| | | Example 1 | Example 2 | Comparative Example 1 | Comparative Example 2 | Comparative Example 3 | Comparative Example 4 | Comparative Example 5 | Comparative Example 6 |
|---|---|---|---|---|---|---|---|---|---|
| Polymer | Molecular weight distribution (Mw/Mn) [—] | 1.27 | 1.24 | 1.85 | 1.47 | 1.63 | 1.30 | 1.27 | 1.31 |
| | Number average molecular weight (Mn) [—] | $2.8 \times 10^4$ | $2.6 \times 10^4$ | $2.9 \times 10^4$ | $4.4 \times 10^4$ | $1.1 \times 10^4$ | $4.9 \times 10^4$ | $4.1 \times 10^4$ | $3.1 \times 10^4$ |
| | Weight average molecular weight (Mw) [—] | $3.6 \times 10^4$ | $3.3 \times 10^4$ | $5.5 \times 10^4$ | $6.5 \times 10^4$ | $1.7 \times 10^4$ | $6.4 \times 10^4$ | $5.2 \times 10^4$ | $4.1 \times 10^4$ |
| | Proportion of components having molecular weight of less than 6,000 [%] | 0.05 | 0.37 | 1.60 | 0.00 | 13.41 | 0.10 | 0.21 | 0.00 |
| | Proportion of components having molecular weight of less than 10,000 [%] | 0.52 | 0.87 | 4.60 | 0.00 | 34.54 | 0.29 | 0.32 | 0.21 |
| | Proportion of components having molecular weight of greater than 80,000 [%] | 3.20 | 1.84 | 22.89 | 35.18 | 1.28 | 20.16 | 12.44 | 6.52 |
| | Proportion of components having molecular weight of greater than 100,000 [%] | 1.23 | 0.68 | 15.67 | 24.25 | 0.82 | 11.53 | 6.05 | 3.00 |
| Evaluation | Film reduction rate under low irradiation [—] | A | A | B | A | B | A | A | A |
| | γ Value [—] | A | B | C | A | C | A | A | A |
| | Sensitivity (Eth) [—] | A | A | C | C | A | C | C | C |

It can be seen from Table 1 that when a polymer is used that has a molecular weight distribution (Mw/Mn) of less than 1.48 and in which the proportion of components having a molecular weight of less than 6,000 is no greater than 0.5% and the proportion of components having a molecular weight of greater than 80,000 is no greater than 6.0%, it is possible to provide a positive resist with which reduction of the film reduction rate under low irradiation and improvement of the γ value and sensitivity are achieved in a favorable balance

INDUSTRIAL APPLICABILITY

Through the presently disclosed polymer, it is possible to provide a positive resist having a low film reduction rate under low irradiation, a high γ value, and high sensitivity.

Moreover, through the presently disclosed positive resist composition, it is possible to efficiently form a high-resolution pattern.

The invention claimed is:

1. A polymer comprising an α-methylstyrene unit and a methyl α-chloroacrylate unit, wherein
   the polymer has a molecular weight distribution (Mw/Mn) of less than 1.48,
   a proportion of components having a molecular weight of less than 6,000 is no greater than 0.5%,
   a proportion of components having a molecular weight of greater than 80,000 is no greater than 6.0%, and
   a proportion of components having a molecular weight of greater than 100,000 is at least 0.5%.

2. The polymer according to claim 1, wherein
   a proportion of components having a molecular weight of less than 10,000 is no greater than 0.8%.

3. The polymer according to claim 1 having a weight average molecular weight (Mw) of at least 30,000.

4. A positive resist composition comprising the polymer according to claim 1 and a solvent.

* * * * *